(12) United States Patent
Morris, III

(10) Patent No.: US 8,773,193 B2
(45) Date of Patent: Jul. 8, 2014

(54) METHODS, DEVICES, AND SYSTEMS FOR SWITCHED CAPACITOR ARRAY CONTROL

(71) Applicant: wiSpry, Inc., Irvine, CA (US)

(72) Inventor: Arthur S. Morris, III, Raleigh, NC (US)

(73) Assignee: wiSpry, Inc., Irvine, CA (US)

( * ) Notice: Subject to any disclaimer, the term of this patent is extended or adjusted under 35 U.S.C. 154(b) by 0 days.

(21) Appl. No.: 13/839,310

(22) Filed: Mar. 15, 2013

(65) Prior Publication Data

US 2014/0015589 A1    Jan. 16, 2014

Related U.S. Application Data

(60) Provisional application No. 61/671,494, filed on Jul. 13, 2012.

(51) Int. Cl.
*G06F 7/64*   (2006.01)
*G06G 7/18*   (2006.01)
*G06G 7/19*   (2006.01)

(52) U.S. Cl.
USPC .......................................................... 327/337

(58) Field of Classification Search
USPC .......................................................... 327/337
See application file for complete search history.

(56) References Cited

U.S. PATENT DOCUMENTS

| | | | |
|---|---|---|---|
| 8,009,074 B2* | 8/2011 | Lou et al. | 341/150 |
| 2010/0026264 A1* | 2/2010 | Ben-Yaakov et al. | 323/283 |
| 2012/0286888 A1* | 11/2012 | Hsieh et al. | 331/117 FE |

FOREIGN PATENT DOCUMENTS

WO    WO 2014/011345    1/2014

* cited by examiner

*Primary Examiner* — Quan Tra
(74) *Attorney, Agent, or Firm* — Jenkins, Wilson, Taylor & Hunt, P.A.

(57) ABSTRACT

The present subject matter relates to methods, devices, and systems for switched array control. For an array of two-state elements that can be independently positioned in either an active state or an inactive state, the methods, devices, and systems can determine a linear number D of elements in the active state needed to achieve a total combined activity corresponding to a desired behavior, compare a number A of elements in an active state to the linear number D of elements needed to achieve the desired behavior, activate a first number n of inactive elements, and deactivate a second number m of active elements, wherein the difference between the first number n and the second number m is equal to the difference between the linear number D of elements needed to achieve the desired behavior and the present number A of elements in an active state.

29 Claims, 4 Drawing Sheets

| 1 | 1 | 1 | 1 | 1 | 1 | 1 | 1 |
|---|---|---|---|---|---|---|---|
| 1 | 1 | 1 | 1 | 1 | 1 | 1 | 1 |
| 1 | 1 | 1 | 1 | 1 | 1 | 1 | 1 |
| 1 | 1 | 1 | 1 | 1 | 1 | 1 | 0→1 |
| 0 | 0 | 0 | 0 | 0 | 0 | 0 | 0 |
| 0 | 0 | 0 | 0 | 0 | 0 | 0 | 0 |
| 0 | 0 | 0 | 0 | 0 | 0 | 0 | 0 |
| 0 | 0 | 0 | 0 | 0 | 0 | 0 | 0 |

100

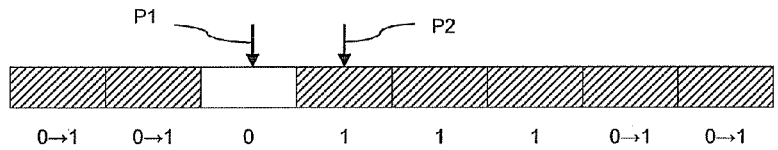
Fig. 5E
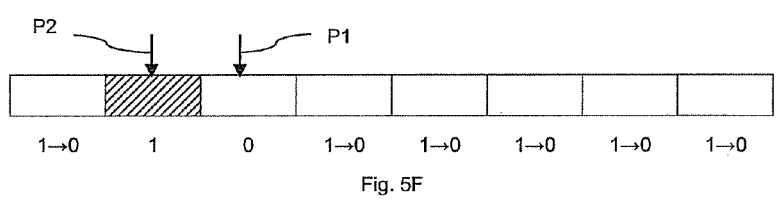
Fig. 5F
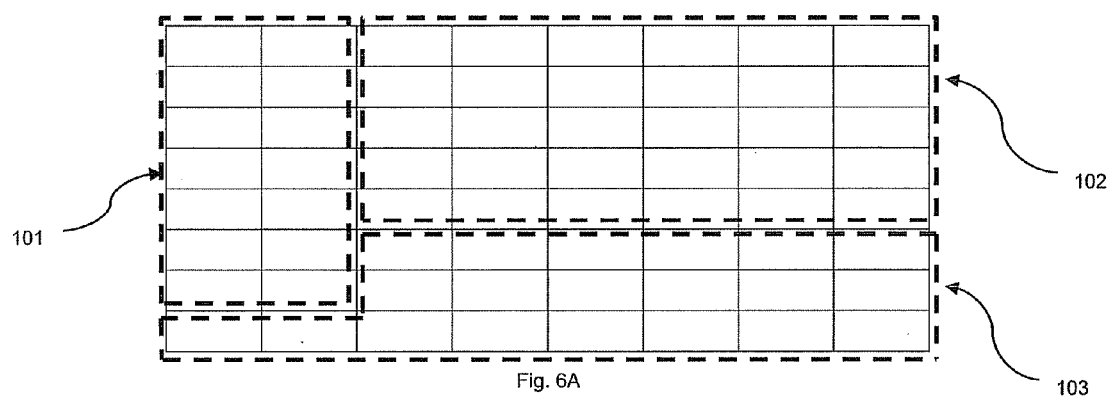
Fig. 6A
Fig. 6B

METHODS, DEVICES, AND SYSTEMS FOR SWITCHED CAPACITOR ARRAY CONTROL

PRIORITY CLAIM

The present application claims the benefit of U.S. Provisional Patent Application Ser. No. 61/671,494, filed Jul. 13, 2012, the disclosure of which is incorporated herein by reference in its entirety.

TECHNICAL FIELD

The subject matter disclosed herein relates generally to methods, devices, and systems for operating an array of two-state elements that can be independently positioned in either an active state or an inactive state. More particularly, the subject matter disclosed herein relates to systems and methods for switched capacitor array control.

BACKGROUND

Arrays of identical or substantially structurally similar switched capacitor elements can be electrically combined into banks (e.g., through interconnects) to provide a given amount of collective capacitance. In previous implementations of such arrays, sub-banks have been grouped and driven with single control lines to minimize the number of driving circuits required. This configuration can use a mixture of linear and binary control sequences. As binary boundaries are reached, some sub-banks are turned on and others off. This may create a transient where the total bank capacitance varies outside of the range between the starting and finishing states. For cold-switching, this is not an issue. However, for hot switching where the circuit is in operation during the switching event, this may cause an undesired response of the circuit using the capacitor during the transient. Additionally, the fixed grouping of the elements leads to high switching rates and specific distributions of element switching rates that depend heavily on the application.

For example, as shown in FIG. 1, a plurality of switched capacitor elements 10 are arranged in an array 100. In particular, as shown in FIG. 1, array 100 can be an 8×8 array comprising 64 of the elements 10. For instance, elements 10 can each have a 250 fF capacitance change for a total tuning range of 16 pF. Elements 10 can be grouped into binary element groups to minimize the number of control lines needed to select any of the plurality of the elements 10. In the 8×8 array shown in FIG. 1, for example, the 64 elements 10 can be grouped into six control bits. In this arrangement, there exists a single bit 10a that is not easily combined into the binary scheme. In conventional control arrangements, this single bit could be configured as a comparatively smaller capacitance bit (e.g. 125 fF compared to 250 fF) to add resolution and maintain the binary control for a total of 7 bits as shown in FIG. 2.

In one particular case in which the total capacitance of the array is switched from 7.75 pF (e.g., binary control word of 011111) to 8.00 pF (e.g., binary control word of 100000), this single bit change in total capacitance results in nearly all of the bits changing state as shown in FIG. 3. This nearly entire switching can contribute to lower product life and, depending on which transition is faster, might result in temporarily having nearly the full array capacitance or nearly none of the array capacitance at some point during the transition. For devices where opening starts earlier than closing, for example, the tuning capacitance would drop briefly to near zero. This drop would impact circuit performance during the transient so this could be a critical shortcoming for hot switching applications. Also, when wearout is a lifetime limiter, this approach causes wear on all elements.

Accordingly, it would be desirable for an array control system and method to effectively control the operation of an array of individually switchable elements without capacitance excursions during tuning and without array lifetime limitations.

SUMMARY

In accordance with this disclosure, methods, devices, and systems for switched capacitor array control are provided. In one aspect, a method for operating an array of two-state elements that can be independently positioned in either an active state or an inactive state is provided. The method can comprise determining a linear number D of elements in the active state needed to achieve a total combined activity corresponding to a desired behavior and comparing a number A of elements in an active state to the linear number D of elements needed to achieve the desired behavior. A first number n of inactive elements can be activated, and a second number m of active elements can be deactivated such that the difference between the first number n and the second number m is equal to the difference between the linear number D of elements needed to achieve the desired behavior and the present number A of elements in an active state. In other words, $(n-m)=(D-A)$.

In another aspect, a system for switched capacitor array control can comprise an array of two-state elements that can be independently positioned in either an active state or an inactive state and a controller. The controller can be configured to receive an input corresponding to a desired behavior, to determine a linear number D of the two-state elements in the active state needed to achieve a total combined activity corresponding to the desired behavior, to compare a number A of the elements in the active state to the linear number D of the elements needed to achieve the desired behavior, and to activate a first number n of inactive ones of the elements and deactivating a second number m of active ones of the elements, wherein the difference between the first number n and the second number m is equal to the difference between the linear number D of the elements needed to achieve the desired behavior and the present number A of the elements in an active state.

Although some of the aspects of the subject matter disclosed herein have been stated hereinabove, and which are achieved in whole or in part by the presently disclosed subject matter, other aspects will become evident as the description proceeds when taken in connection with the accompanying drawings as best described hereinbelow.

BRIEF DESCRIPTION OF THE DRAWINGS

The features and advantages of the present subject matter will be more readily understood from the following detailed description which should be read in conjunction with the accompanying drawings that are given merely by way of explanatory and non-limiting example, and in which:

FIGS. 5A-5F are schematic representations of an array of tunable capacitive elements being switched using a method according to an embodiment of the presently disclosed subject matter;

FIG. 6A is a schematic representation of an array of tunable capacitive elements arranged in distinct element banks according to an embodiment of the presently disclosed subject matter;

FIG. 6B is a sequential binary row-column scheme for an array of tunable capacitive elements according to an embodiment of the presently disclosed subject matter;

DETAILED DESCRIPTION

The present subject matter provides methods, devices, and systems for switched capacitor array control that can address the issues with transients and lifetime mentioned above with respect to conventional binary control schemes. In one aspect, the present subject matter provides a method for operating an array 100 of two-state elements 10 that can be independently positioned in either an active state or an inactive state. For example, as discussed above, each of the two-state elements 10 can comprise a capacitor, and each element can have its own independently-controllable driver.

For such an array 100, an input corresponding to a desired behavior can be provided. Despite the problems associated with conventional control schemes as discussed above, a binary input of a control can advantageously limit the number of bits in the control communication and registers. To avoid this wholesale switching of conventional binary control algorithms, however, instead of a fixed assignment of elements into binary sub-banks, the binary control word can be converted to a linear number D of the elements 10 (e.g., thermometer code) that should be turned on to achieve a total combined activity corresponding to the desired behavior. Where each of the two-state elements 10 comprises a capacitor, for example, the desired behavior can comprise a total desired capacitance.

The linear number D of the elements 10 needed to achieve the desired behavior can be compared against a present number A of the elements 10 presently in an active state. Based on this comparison, a first number n of inactive elements can be activated, and a second number m of active elements can be deactivated, wherein the difference between the first number n and the second number m is equal to the difference between the linear number D of the elements 10 needed to achieve the desired behavior and the present number A of the elements 10 in an active state.

In one particular example, when the present number A of elements in an active state is less than the linear number D of the elements 10 needed to achieve the desired behavior, the first number n of inactive elements to be activated can equal the difference between the present number A of the elements 10 in an active state and the linear number D of the elements 10 needed to achieve the desired behavior (i.e., n=(D−A)), but the second number m of active elements to be deactivated can equal zero.

Conversely, when the present number A of the elements 10 in an active state is greater than the linear number D of the elements 10 needed to achieve the desired behavior, the first number n of inactive elements to be activated can be equal to zero, while the second number m of active elements to be deactivated can be equal to the difference between the present number A of the elements 10 in an active state and the linear number D of the elements 10 needed to achieve the desired behavior (i.e., m=(A−D)).

Figure 1:
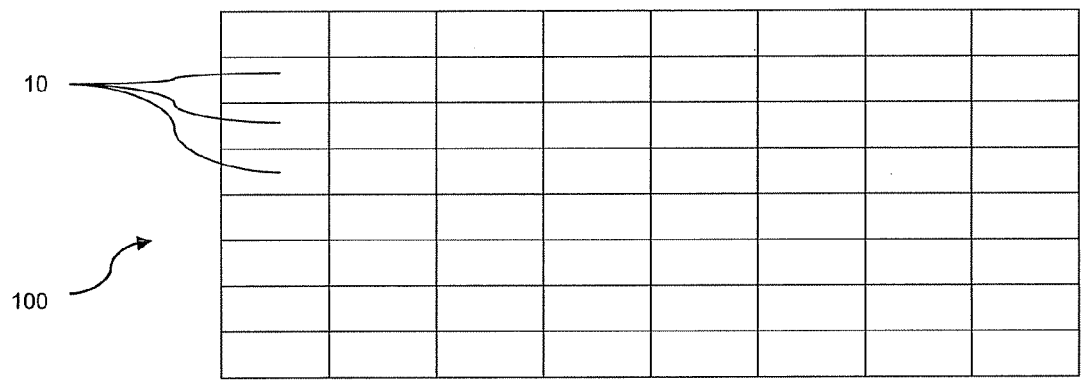
FIG. 1 is a schematic representation of an array of tunable capacitive elements.
Figure 2:
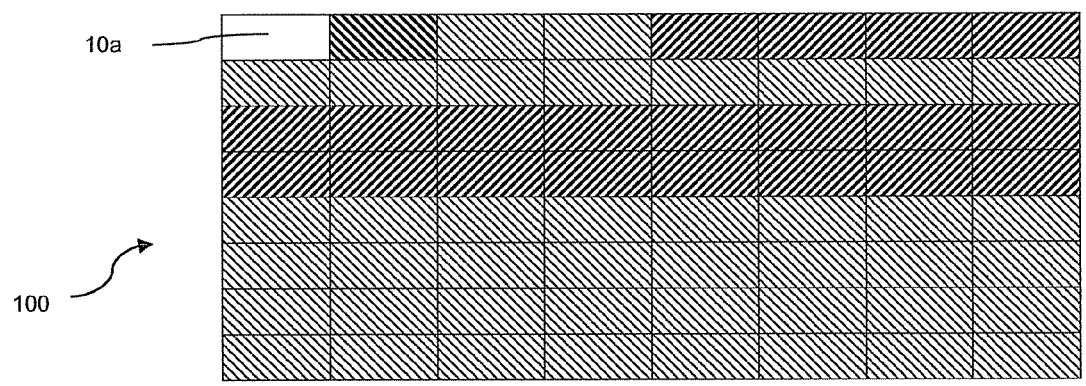
FIG. 2 is a schematic representation of an array of tunable capacitive elements arranged in binary groups according to a conventional control arrangement.
Figure 3:
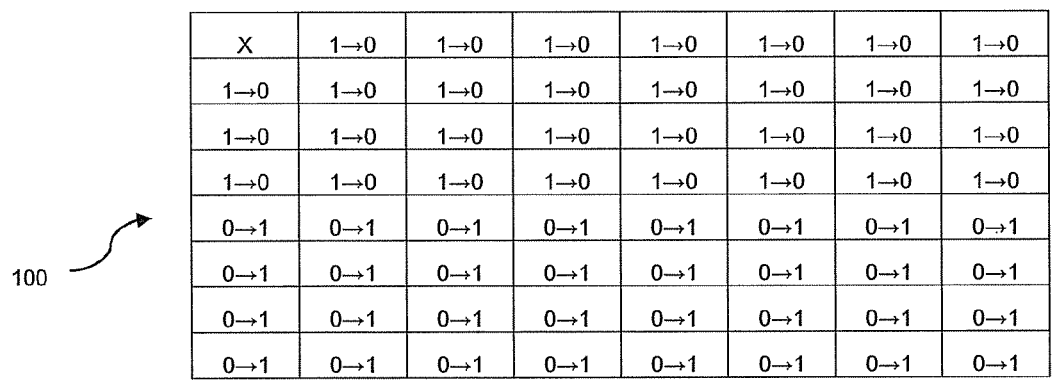
FIG. 3 is a schematic representation of an array of tunable capacitive elements during a switching event according to a conventional control arrangement.
Figure 4:
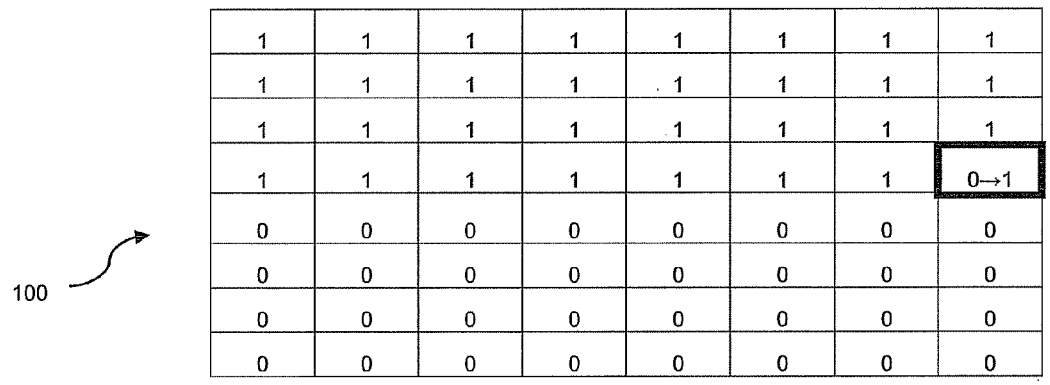
FIG. 4 is a schematic representation of an array of tunable capacitive elements during a switching event according to an embodiment of the presently disclosed subject matter.

In this way, referring again to the example discussed with respect to FIG. 3, a change in total capacitance from 7.75 pF (e.g., binary control word of 011111) to 8.00 pF (e.g., binary control word of 100000) can be accomplished by going from 31 of the elements 10 being turned on to 32 of the elements 10. Because the elements 10 can be independently switched, this switching event can simply involve turning one more of element 10 to an active state as shown in FIG. 4. As a result, controlling the utilization of the elements 10 within the array 100 in this manner can minimize unnecessary cycling of elements. In addition to limiting capacitance excursions during tuning, it is noted that this approach also utilizes the "extra bit."

Alternatively or in addition to minimizing cycling, it is recognized that the distribution of element switching rates can depend heavily on the application. If the above method is used directly, for example, the first of the elements 10 can tend to be on most of the time while the last of the elements 10 would rarely be used. In comparison, those of the elements 10 in the middle of the array 100 might see switching rates approaching that of the array 100 as a whole. This behavior can limit the product reliability to near that of the individual elements.

Figure 5A:
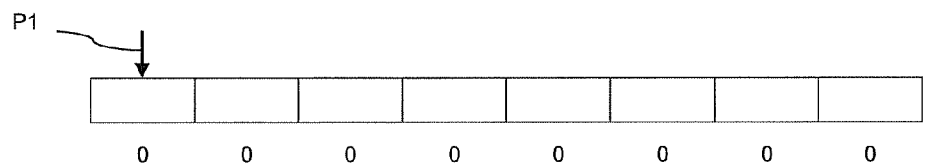
Figure 5B:
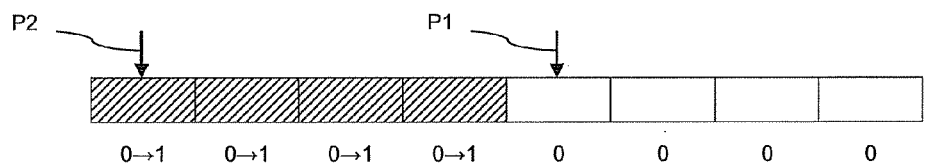
Figure 5C:
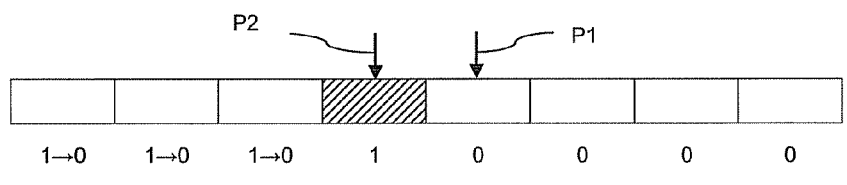
Figure 5D:
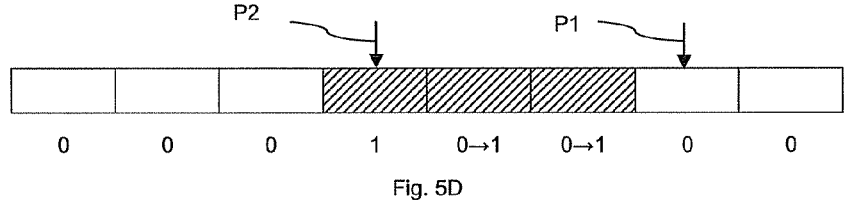

To address this distribution, the group of the elements 10 that are utilized for a given tuning state can additionally be rotated through the array 100. For example, as shown in FIGS. 5A through 5D, elements 10 can be activated during capacitance increases on one end (e.g. right) as shown in FIGS. 5B and 5C, and they can be deactivated from the other end (e.g., left) during capacitance reductions as shown in FIG. 5D. In addition, the set of the elements 10 in an array 100 can act as a logical circular register so that as elements 10 are activated that cross the upper boundary, they can continue to be added from the lower boundary as shown in FIG. 5E. This can also apply to elements 10 turning off across the upper boundary as shown in FIG. 5F. This approach can even out the switching rate of individual ones of the elements 10 across the array for a reasonable distribution of tuning state transitions, which can help to maximize the overall product lifetime.

This rotation of the present number A of the elements 10 in an active state can further be assisted by forcing both the first number n of elements to be activated and the second number m of elements to be deactivated to be non-zero values. Specifically, for example, which of the elements 10 are utilized can be rotated even for a fixed tuning setting (i.e., when a tuning word does not change) by activating and deactivating an equal, non-zero number of inactive and active elements, respectively (i.e. n=m). This fixed-state cycling can increase cycling but can decrease dwell time in the "on" state (i.e., hold-down time), which can also improve average product lifetime. Whether this should be done and at what base rate can depend on the particular element reliability limitations.

Regardless of the number of the elements 10 that are switched or the rate at which they are cycled, however, the elements 10 can be activated and/or deactivated according to a predetermined sequential order of the elements 10 in the array 100, which can be followed, for example, in a continuous, repeating pattern. For example, this sequential order can be defined in a mapping table in which the predetermined sequential order is mapped to locations of the elements 10 within the array 100. Such a mapping table can be a fixed table, or it can be a programmable table.

In one particular method, referencing the mapping table can comprise activating one or more of the elements 10 starting at a first pointer P1 that identifies an inactive element that is next to be activated according to the predetermined sequential order, and advancing the first pointer P1 by n positions in the predetermined sequential order. In particular, an inactive element identified by the first pointer P1 can be activated, the first pointer P1 can be advanced by one position in the predetermined sequential order, and this activating and advancing can be repeated until n inactive elements have been activated. (See, e.g., FIGS. 5A-5F)

Similarly, a mapping table can likewise be used to deactivate one or more of the elements 10 starting at a second pointer P2 that identifies an active element that is next to be deactivated according to the predetermined sequential order, and advancing the second pointer P2 by m positions in the predetermined sequential order. In particular, one active element identified by the second pointer P2 can be deactivated, the second pointer P2 can be advanced by one position in the predetermined sequential order, and the steps of deactivating and advancing can be repeated until m active elements have been deactivated. (See, e.g., FIGS. 5B-5F)

It is noted that, while the base 'sequence' can correspond to a particular physical configuration, the particular sequence used can be selected to optimize the operation and reliability. For example, to minimize RF variation during tuning, activating a first number n of inactive elements can comprise activating a plurality of the elements 10 that are spaced apart from each other within the array 100. In this regard, it may be advantageous to interleave the sequence across the array 100 so that the elements 10 are being added in different locations to average out differing parasitics and element Q's, if present.

In another aspect, the method for operating an array 100 of two-state elements 10 can be implemented in a hardware system. If the application is fixed at design time, it may be built hardwired into the design. It can be desirable, however, that an array be flexible to be used in many applications, leveraging the design across a larger market. To enable this flexibility, a programmable approach can be used to assign the sequence above to a physical configuration. This approach may be advantageous to optimize the RF performance of the product. Referring again to the example of an 8×8 array, switching of elements in the array according to the present subject matter can be applied in a given application in many ways. For example, the elements can be connected to three different banks 101, 102, and 103 as shown in FIGS. 6A to 6D. The bank boundaries can be predetermined and fixed, or they can be selectively redefined/reprogrammed by a user.

Figure 6C:
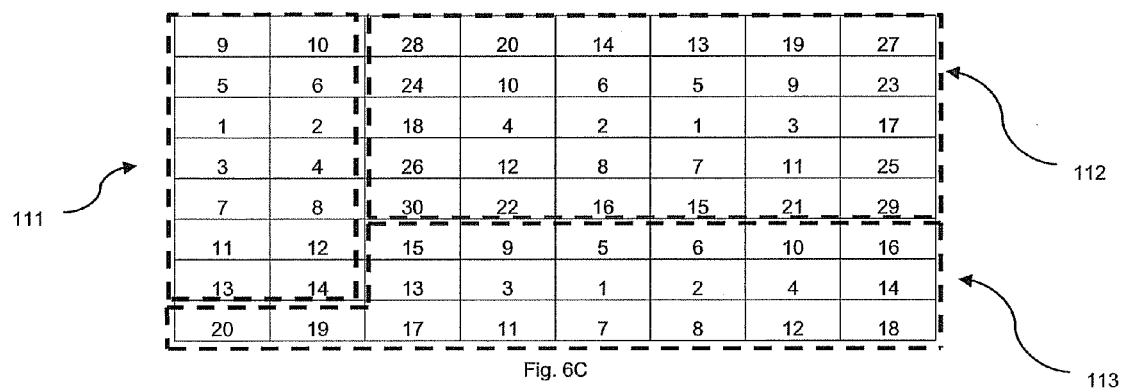
FIG. 6C is a map of an activation sequence for an array of tunable capacitive elements according to an embodiment of the presently disclosed subject matter.

As discussed above, giving each element a unique address can require 6 bits each. The arrangement of these addresses can be arbitrary, so a sequential binary row-column scheme 110 (e.g., 0-63 in decimal) can be selected as shown in FIG. 6B. This sequential binary row-column scheme 110 can be predetermined and fixed, or the binary addresses of each element 10 can be selectively reassigned/reprogrammed as desired. Although FIG. 6B identifies each of the three different banks 101, 102, and 103, it should be noted that the sequential binary row-column scheme 110 can assign an address to each of the elements 10 independently from the assignment of the elements 10 to one of the three different banks 101, 102, and 103. A sequence of bits 111, 112, and 113 can be assigned within each bank as shown in FIG. 6C. To associate the addresses of the elements 10 according to the sequential binary row-column scheme 110 with the sequences 111, 112, and 113, a list of for each bank can provide the element addresses in the desired order.

Figure 6D:
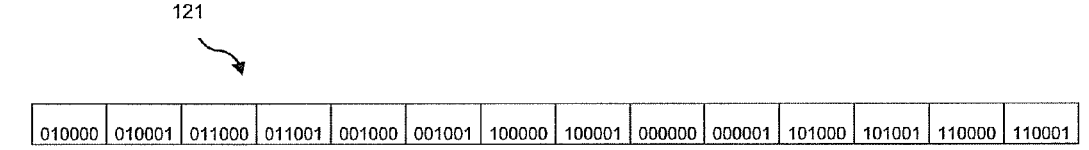
FIG. 6D is a list providing addresses for an array of tunable capacitive elements in a desired order according to an embodiment of the presently disclosed subject matter.

For example, a list 121 containing the element addresses for the first bank 101 are shown in FIG. 6D. This list 121 can either be set in non-volatile memory during manufacturing for a specific customer/application, or it can be loaded into a register by the customer during runtime. This method for identifying the predetermined sequential order can be advantageous in configurations where the array control is completely flexible and software programmable.

Alternatively, where the elements 10 are organized into a plurality of distinct element banks (e.g., three different banks 101, 102, and 103), and a separate register is applied for each bank (e.g., sequences 111, 112, and 113), the binary word can be converted for each register into the linear thermometer code. This code can be hard wired to the beams, such as in a specific order as discussed above with respect to FIG. 6C.

While there may be many ways to implement this approach in hardware, it is worth detailing some specifics for operation. For example, the moving window may be specified by a start index and an 'on' count. Or it could be specified by a start index and a stop index. It can be advantageous for the lookup table above to be converted to a fixed logic configuration to minimize computation during tuning events. The moving window implementation can also minimize the computation. This is to avoid delays, minimize chip size, and possibly avoid the need for clocked logic.

The implementation can involve an k by k multiplexer where k is the number of elements. Note that each address appears once and only once in the total input list. The multiplexer is set by the list of addresses. Specific banks then become sequential sections of the overall output list.

Note that this logic for individual elements can also be applied to sub-groups (or cells) containing multiple elements within which a consistent sequence is always followed before moving on to the next sub-group in the list.

The present subject matter can be embodied in other forms without departure from the spirit and essential characteristics thereof. The embodiments described therefore are to be considered in all respects as illustrative and not restrictive. Although the present subject matter has been described in terms of certain preferred embodiments, other embodiments that are apparent to those of ordinary skill in the art are also within the scope of the present subject matter.

What is claimed is:

1. A method for operating an array of two-state elements that can be independently positioned in either an active state or an inactive state, the method comprising:
   determining a linear number D of elements in the active state needed to achieve a total combined activity corresponding to a desired behavior;
   comparing a number A of elements in an active state to the linear number D of elements needed to achieve the desired behavior; and
   activating a first number n of inactive elements and deactivating a second number m of active elements, wherein the difference between the first number n and the second number m is equal to the difference between the linear number D of elements needed to achieve the desired behavior and the present number A of elements in an active state.

2. The method of claim 1, wherein each of the two-state elements comprises a capacitor; and
   wherein the desired behavior comprises a total desired capacitance.

3. The method of claim 1, wherein determining a linear number D of elements needed to achieve the desired behavior comprises:
receiving an input corresponding to a desired behavior; and
determining a linear number D of elements need to achieve the total combined activity corresponding to the desired behavior.

4. The method of claim 3, wherein the input comprises a binary input.

5. The method of claim 1, wherein, when the present number A of elements in an active state is less than the linear number D of elements needed to achieve the desired behavior, activating a first number n of inactive elements comprises activating a number of inactive elements equal to the difference between the present number A of elements in an active state and the linear number D of elements needed to achieve the desired behavior, and deactivating a second number m of active elements comprises deactivating zero elements.

6. The method of claim 1, wherein, when the present number A of elements in an active state is greater than the linear number of elements D needed to achieve the desired behavior, activating a first number n of inactive elements comprises activating zero elements, and deactivating a second number m of active elements comprises deactivating a number of active elements equal to the difference between the present number A of elements in an active state and the linear number D of elements needed to achieve the desired behavior.

7. The method of claim 1, wherein n and m are both non-zero values.

8. The method of claim 7, wherein, when the number of elements in an active state is equal to the linear number of elements needed to achieve the desired behavior, activating a first number n of inactive elements and deactivating a second number m of active elements comprises activating and deactivating an equal, non-zero number of inactive and active elements, respectively. (i.e. n=m).

9. The method of claim 1, wherein activating a first number n of inactive elements comprises activating a plurality of elements that are spaced apart from each other within the array.

10. The method of claim 1, wherein activating a first number n of inactive elements comprises activating one or more elements according to a predetermined sequential order of the elements in the array.

11. The method of claim 10, wherein the predetermined sequential order is followed in a continuous, repeating pattern.

12. The method of claim 10, wherein activating one or more elements according to a predetermined sequential order of the elements in the array comprises referencing a mapping table in which the predetermined sequential order is mapped to locations of the elements within the array.

13. The method of claim 12, wherein the mapping table is one of a fixed or a programmable table.

14. The method of claim 12, wherein referencing a mapping table comprises:
activating one or more elements starting at a first pointer that identifies an inactive element that is next to be activated according to the predetermined sequential order; and
advancing the first pointer by n positions in the predetermined sequential order.

15. The method of claim 14, wherein referencing a mapping table comprises:
activating an inactive element identified by the first pointer;
advancing the first pointer by one position in the predetermined sequential order; and
repeating the steps of activating and advancing until n inactive elements have been activated.

16. The method of claim 10, wherein the predetermined sequential order of the elements in the array is interleaved across the array.

17. The method of claim 1, wherein deactivating a second number m of active elements comprises deactivating one or more elements according to a predetermined sequential order of the elements in the array.

18. The method of claim 17, wherein the predetermined sequential order is followed in a continuous, repeating pattern.

19. The method of claim 17, wherein deactivating one or more elements according to a predetermined sequential order of the elements in the array comprises referencing a mapping table in which the predetermined sequential order is mapped to locations of the elements within the array.

20. The method of claim 19, wherein the mapping table is one of a fixed or a programmable table.

21. The method of claim 19, wherein referencing a mapping table comprises:
deactivating one or more elements starting at a second pointer that identifies an active element that is next to be deactivated according to the predetermined sequential order; and
advancing the second pointer by m positions in the predetermined sequential order.

22. The method of claim 21, wherein referencing a mapping table comprises:
deactivating one active element identified by the second pointer;
advancing the second pointer by one position in the predetermined sequential order; and
repeating the steps of deactivating and advancing until m active elements have been deactivated.

23. The method of claim 17, wherein the predetermined sequential order of the elements in the array is interleaved across the array.

24. A system for switched capacitor array control comprising:
an array of two-state elements that can be independently positioned in either an active state or an inactive state; and
a controller configured to receive an input corresponding to a desired behavior, to determine a linear number D of the two-state elements in the active state needed to achieve a total combined activity corresponding to the desired behavior, to compare a number A of the elements in the active state to the linear number D of the elements needed to achieve the desired behavior, and to activate a first number n of inactive ones of the elements and deactivating a second number m of active ones of the elements, wherein the difference between the first number n and the second number m is equal to the difference between the linear number D of the elements needed to achieve the desired behavior and the present number A of the elements in an active state.

25. The system of claim 24, wherein each of the two-state elements comprises a capacitor; and
wherein the desired behavior comprises a total desired capacitance.

26. The system of claim 24, wherein each of the two-state elements is assigned a unique address.

27. The system of claim 26, wherein the unique address comprises a unique binary identifier.

28. The system of claim 24, wherein the array of two-state elements are arranged in one or more discrete banks each containing a subset of the two-state elements.

29. The system of claim 28, wherein the two-state elements are each assigned a sequential number within one of the one or more discrete banks;
  wherein the controller is configured to activate the first number n of inactive ones of the elements and deactivating the second number m of active ones of the elements in order of the sequential number of the two-state elements within the one of the one or more discrete banks.

* * * * *